US012081136B2

(12) United States Patent
Zheng et al.

(10) Patent No.: US 12,081,136 B2
(45) Date of Patent: Sep. 3, 2024

(54) INVERTER MODULE AND INVERTER

(71) Applicant: Sungrow Power Supply Co., Ltd., Hefei (CN)

(72) Inventors: Hao Zheng, Hefei (CN); Qiyao Zhu, Hefei (CN); Jun Tan, Hefei (CN); Jie Ding, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 329 days.

(21) Appl. No.: 17/584,080

(22) Filed: Jan. 25, 2022

(65) Prior Publication Data
US 2022/0271682 A1 Aug. 25, 2022

(30) Foreign Application Priority Data

Feb. 19, 2021 (CN) .......................... 202110189189.3

(51) Int. Cl.
*H02M 7/00* (2006.01)
*H01L 23/50* (2006.01)
(Continued)

(52) U.S. Cl.
CPC ............ *H02M 7/003* (2013.01); *H01L 23/50* (2013.01); *H02M 7/487* (2013.01); *H02M 7/5387* (2013.01); *H05K 7/20927* (2013.01)

(58) Field of Classification Search
CPC .......... H02M 7/00; H02M 7/003; H02M 7/42; H02M 7/48; H02M 7/483; H02M 7/487;
(Continued)

(56) References Cited

U.S. PATENT DOCUMENTS

2008/0186751 A1* 8/2008 Tokuyama ............ H02M 7/003
363/141
2010/0020470 A1 1/2010 Edmunds et al.
(Continued)

FOREIGN PATENT DOCUMENTS

CN 109510474 A 3/2019
CN 209709698 U * 11/2019 ........... H01L 23/427
(Continued)

OTHER PUBLICATIONS

First Office Action for Chinese Application No. 202110189189.3, dated Jul. 27, 2023.
(Continued)

*Primary Examiner* — Thienvu V Tran
*Assistant Examiner* — Shahzeb K Ahmad
(74) *Attorney, Agent, or Firm* — Wolf, Greenfield & Sacks, P.C.

(57) ABSTRACT

An inverter module and an inverter are provided. The inverter module includes at least two capacitors and at least one power unit group. The at least one power unit group each comprises one or more power units. The capacitors are connected in series and parallel to form a capacitor head terminal, a capacitor end terminal and a capacitor midpoint, where capacitance between the capacitor midpoint and the capacitor head terminal is the same as capacitance between the capacitor midpoint and the capacitor end terminal. Positive poles of DC sides of the power units are equidistantly connected with the capacitor head terminal, negative poles of the DC sides of the power units are equidistantly connected with the capacitor end terminal, and midpoints of the DC sides of the power units are equidistantly connected with the capacitor midpoint.

20 Claims, 14 Drawing Sheets

(51) Int. Cl.
*H02M 7/487* (2007.01)
*H02M 7/5387* (2007.01)
*H05K 7/20* (2006.01)

(58) Field of Classification Search
CPC ........ H02M 7/49; H02M 7/493; H02M 7/538; H02M 7/5387; H05K 7/20909; H05K 7/20927; H01L 23/50
See application file for complete search history.

(56) References Cited

U.S. PATENT DOCUMENTS

| | | | | |
|---|---|---|---|---|
| 2012/0243273 | A1* | 9/2012 | Rasoanarivo | H02M 5/293 363/41 |
| 2013/0051105 | A1* | 2/2013 | Wang | H02M 1/42 363/132 |
| 2015/0222201 | A1* | 8/2015 | Nakashima | H05K 7/1432 363/131 |
| 2018/0262124 | A1* | 9/2018 | Hsin | H02M 1/42 |
| 2021/0327811 | A1 | 10/2021 | Zheng et al. | |

FOREIGN PATENT DOCUMENTS

| | | | | |
|---|---|---|---|---|
| CN | 111130361 A | * | 5/2020 | ............... H01B 5/02 |
| CN | 212324008 U | | 1/2021 | |
| JP | H07-007958 A | | 1/1995 | |
| JP | 4625238 B2 | | 2/2011 | |

OTHER PUBLICATIONS

Extended European Search Report for European Application No. 22150638.9, dated Jun. 28, 2022.
Examination Report for European Application No. 22150638.9, dated Jun. 19, 2024.
Bose, Modern Power electronics and AC drives—part 1. In: XP055922858. Dec. 30, 2002, Part 1:1-400.

* cited by examiner

INVERTER MODULE AND INVERTER

This application claims the priority to Chinese Patent Application No. 202110189189.3, titled "INVERTER MODULE AND INVERTER", filed on Feb. 19, 2021 with the Chinese Patent Office, which is incorporated herein by reference in its entirety.

FIELD

The present disclosure relates to the technical field of power electronics, and in particular to an inverter module and an inverter.

BACKGROUND

According to the conventional technology, as shown in FIG. 1, an inverter includes three power unit groups and a DC support capacitor cell module. Each of the power unit groups provides an output of a phase of the inverter and includes four power units that are connected in parallel with each other.

In addition, in the inverter, all capacitors in the DC support capacitor cell module are connected in parallel with each other through a capacitor bus-bar. DC sides of all the power units are connected in parallel with each other through a power bus-bar. The capacitor bus-bar is connected with the power bus-bar, so that the DC sides of the power units in each group are electrically connected with the DC support capacitor cell module.

By this connection method, distances from the DC sides of the power units to respective potentials of the capacitors are different, and thus impedances between the DC support capacitor cell module and the individual power units are different, resulting in unbalanced current sharing between the power units.

SUMMARY

In view of the above, an inverter module and an inverter are provided according to the present disclosure, to solve the problem of unbalanced current sharing between individual power units due to the connection of the direct current (DC) sides of the power units with a DC support capacitor cell module through two bus-bars in the conventional technology.

In order to achieve the above object, the following technical solutions are provided.

An inverter module is provided according to a first aspect of the present disclosure. The inverter module includes at least two capacitors and at least one power unit group. The at least one power unit group each comprises one or more power units. The capacitors are connected in series and parallel to form a capacitor head terminal, a capacitor end terminal and a capacitor midpoint, where capacitance between the capacitor midpoint and the capacitor head terminal is the same as capacitance between the capacitor midpoint and the capacitor end terminal. Positive poles of DC sides of the power units are equidistantly connected with the capacitor head terminal, negative poles of the DC sides of the power units are equidistantly connected with the capacitor end terminal, and midpoints of the DC sides of the power units are equidistantly connected with the capacitor midpoint.

In an embodiment, the positive poles of the DC sides of the power units are equidistantly connected with the capacitor head terminal through a first bus, the negative poles of the DC sides of the power units are equidistantly connected with the capacitor end terminal through a second bus, and the midpoints of the DC sides of the power units are equidistantly connected with the capacitor midpoint through a third bus.

In an embodiment, the first bus, the second bus and the third bus are implemented by cables or conductive bars.

In an embodiment, in a case that the first bus, the second bus and the third bus are implemented by the conductive bars, the first bus, the second bus and the third bus are integrated into a laminated conductive bar.

In an embodiment, the conductive bars are copper bars or aluminum bars.

In an embodiment, the at least one power unit group each includes more than one power units, the power units in each power unit group are connected in parallel with each other to form an alternating current (AC) side connection point. The AC side connection point is equidistant from AC sides of the power units.

In an embodiment, the power units in each group are connected in parallel with each other through buses.

In an embodiment, an AC bus and an intermediate circulation bus in each of the power units are integrated into a laminated conductive bar.

In an embodiment, each of the power units is implemented by multiple independent IGBT modules connected with each other, or implemented by a packaged module.

In an embodiment, in a case that the inverter module is a three-level inverter module, each of the power units is implemented by three independent two-level IGBT modules connected with each other, or implemented by a three-level packaged module.

In an embodiment, in a case that the power unit is implemented by three two-level IGBT modules connected with each other, the three two-level IGBT modules are arranged in a Y-shape, or arranged in a straight line.

In an embodiment, the power units in each power unit group are arranged at an equal interval in a straight line.

An inverter is provided according to another aspect of the present disclosure. The inverter includes a radiator and any inverter module according to the above aspect of the present disclosure. All the power units in the inverter module are arranged on the radiator inverter.

In an embodiment, in a case that the inverter module includes a first bus, a second bus and a third bus, the first bus, the second bus, the third bus and all the capacitors in the inverter module are arranged on a same side of the power units.

In an embodiment, the first bus, the second bus, the third bus and all the capacitors are arranged above the power units, or arranged on a left side or a right side of the power units.

In an embodiment, the first bus, the second bus, the third bus and all the capacitors are arranged on a same side of the radiator, or arranged on different sides of the radiator.

In an embodiment, all the capacitors are arranged on a same side of the first bus, the second bus and the third bus, or arranged on two sides of the first bus, the second bus and the third bus, and the at least two independent sub-radiators each is arranged with some of the power units.

In an embodiment, the radiator is an integral radiator. Alternatively, the radiator includes at least two independent sub-radiators.

In an embodiment, a flowing direction of a heat dissipation medium of the radiator is: from the DC sides of the power units to AC sides of the power units; or from the AC sides of the power units to the DC sides of the power units; or the same as a direction of arranging the power units in each group.

In an embodiment, the radiator is an air cooling radiator or a liquid cooling radiator.

In an embodiment, the inverter further includes a first housing and a second housing. A first chamber is defined as a space inside the first housing and outside the second housing. A second chamber is defined as a space inside the second housing and is configured as a high protection chamber. An inlet for a heat dissipation medium of the inverter module and an outlet for the heat dissipation medium of the inverter module are arranged on the first housing.

In an embodiment, the first housing and the second housing are independent of each other, the first chamber includes a first sub-chamber and a second sub-chamber that are communicated with each other. All the capacitors are arranged in the first sub-chamber. The radiator is arranged in the second sub-chamber. The first bus, the second bus, the third bus, connection ports of all the capacitors and all the power units are arranged in the second chamber.

In an embodiment, the radiator is an air cooling radiator, the first sub-chamber serves as a first ventilating passage of the inverter, and the second sub-chamber serves as a second ventilating passage of the inverter.

In an embodiment, an insulating plate and a sealing plate are arranged between the capacitors and the second housing.

In an embodiment, the first housing partially coincides with the second housing to form the closed second chamber and the first chamber outside the second chamber, the radiator is arranged in the first chamber, and the first bus, the second bus, the third bus, all the capacitors and all the power units are arranged in the second chamber.

It can be seen from the above technical solutions that, in the inverter module, positive pole of DC sides of all power units are equidistantly connected with a capacitor head terminal, negative poles of the DC sides are equidistantly connected with a capacitor end terminal, and midpoints of the DC sides are equidistantly connected with a capacitor midpoint. In this way, not only voltages at the DC sides of the individual power units are the same, but also impedances between the DC sides of the individual power units and respective potentials of the capacitors are the same. Therefore, currents from the power units to the respective potentials of the capacitors are the same, so that current sharing between the power units is balanced, thereby solving the problem of unbalanced current sharing between individual power units due to the connection of the DC sides of the power units with a DC support capacitor cell module through two bus-bars.

BRIEF DESCRIPTION OF THE DRAWINGS

In order to illustrate technical solutions in embodiments of the present disclosure or the conventional technology more clearly, hereinafter drawings to be used in the description of the embodiments or the conventional technology are described simply. Apparently, the drawings described below are only for the embodiments of present disclosure. For those skilled in the art, other drawings may be obtained based on the provided drawings without any creative work.

DETAILED DESCRIPTION

The technical solutions in the embodiments of the present disclosure are described clearly and completely in conjunction with the drawings in the embodiments of the present disclosure hereinafter. It is apparent that the described embodiments are only some embodiments of the present disclosure, rather than all embodiments. All other embodiments obtained by those skilled in the art based on the embodiments of the present disclosure without any creative work fall within the protection scope of the present disclosure.

In the present disclosure, the relationship terminologies such as first, second or the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a process, method, article or device including a series of elements includes not only the elements but also other elements that are not enumerated, or also includes the elements inherent to the process, method, article or device. Unless expressively limited otherwise, the statement "comprising (including) a . . . " does not exclude the case that other similar elements may exist in the process, method, article or device.

Figure 1:
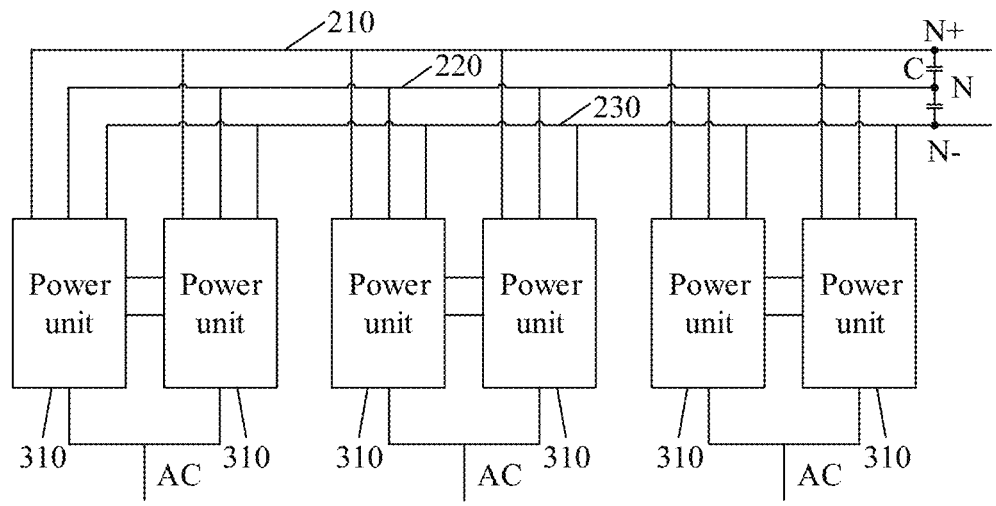
FIGS. 1 to 3 are respectively schematic diagrams of an inverter module according to three embodiments of the present disclosure.
Figure 2:
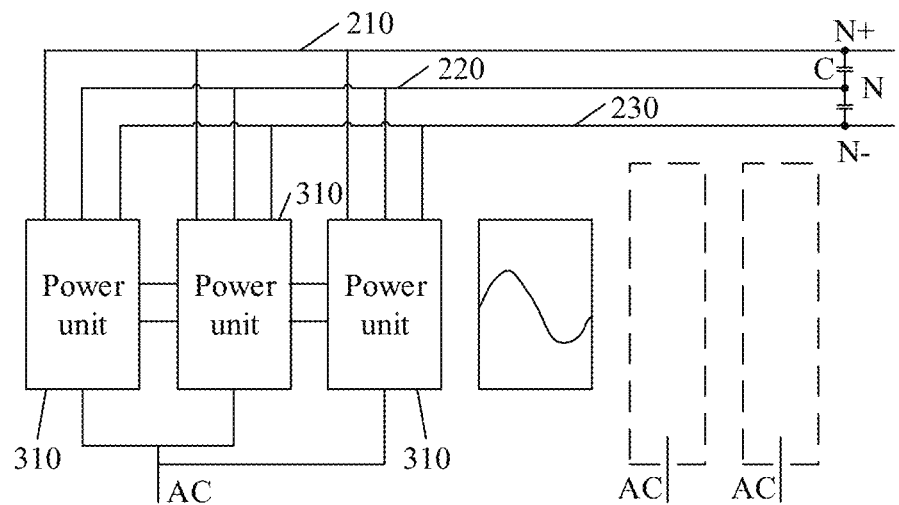
Figure 3:
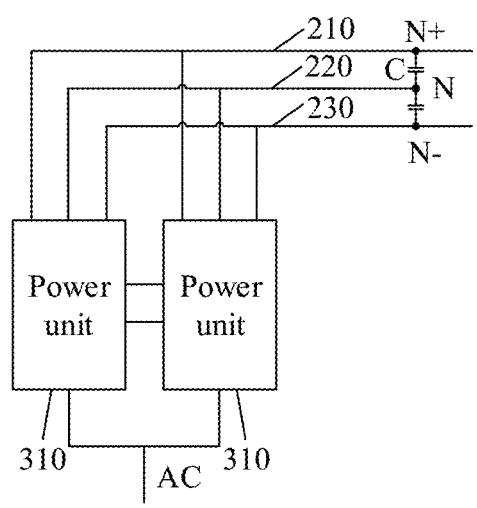

In order to solve the problem of unbalanced current sharing between individual power units due to the connection of the DC sides of the power units with a DC support capacitor cell module through two bus-bars in the conventional technology, an inverter module is provided according to an embodiment of the present disclosure. Referring to FIGS. 1, 2 and 3, the inverter module includes at least two capacitors C and at least one power unit group.

In a case that the inverter module includes one power unit group, as shown in FIG. 3, only one-phase alternating current (AC) power is outputted. In a case that the inverter module includes two power unit groups, two-phase AC power is outputted. In a case that the inverter module includes three power unit groups, as shown in FIG. 1 or 2, three-phase AC power is outputted. In practices, the number of the power unit groups is not limited to the above embodiments, which may be determined according to the actual requirements. All the implementations fall within the protection scope of the present disclosure.

In the inverter module, each power unit group includes one or more power units 310. For example, as shown in FIGS. 1 and 3, each power unit group includes 2 power units 310. As shown in FIG. 2, each power unit group includes 3 power units 310. In practices, the number of the power units 310 may be determined according to the actual requirements, which is not limited herein. All the implementations fall within the protection scope of the present disclosure.

The capacitors C are connected in series and parallel to form a capacitor head terminal N+, a capacitor end terminal N− and a capacitor midpoint N. Capacitance between the capacitor midpoint N and the capacitor head terminal N+ is the same as capacitance between the capacitor midpoint N and the capacitor end terminal N−.

In practices, the capacitor head terminal N+ serves as a positive pole of a DC side of the inverter module, and the capacitor end terminal N− serves as a negative pole of the DC side of the inverter module.

Positive poles of DC sides of the power units 310 are equidistantly connected with the capacitor head terminal N+. Negative poles of the DC sides of the power units 310 are equidistantly connected with the capacitor end terminal N−. In the present disclosure, the term "equidistantly connected" means that the wires for multiple connections have the same length, thereby having the same resistance. Midpoints of the DC sides of the power units 310 are equidistantly connected with the capacitor midpoint N. In this way, not only voltages at the DC sides of the individual power units 310 are the same, but also impedances between the DC sides of the individual power units 310 and respective potentials of the capacitors are the same. Therefore, currents from the individual power units 310 to respective potentials of the capacitors C are the same, so that current sharing between the power units 310 is balanced, thereby solving the problem of unbalanced current sharing between individual power units due to the connection of the DC sides of the power units with a DC support capacitor cell module through two bus-bars in the conventional technology.

It should be noted that in the conventional technology, due to the use of two bus-bars, it is required to adjust positions of parallel connection points to meet requirements of the current sharing between the power units. Therefore, the confluent position of the parallel connection needs to be determined based on a large number of test data. Compared with the conventional technology, the inverter module according to the present disclosure can ensure the current sharing between the power units 310 without a large number of test data. Therefore, the inverter module according to the present disclosure reduces difficulty and cost of the current sharing.

In addition, in the conventional technology, connection of the DC sides through two bus-bars further has problems of large parasitic inductance, long length of the bus and too much connection points. In the embodiment, preferably, the positive poles of the DC sides of the all power units 310 may be all equidistantly connected with the capacitor head terminal N+ through a first bus, the negative poles of the DC sides of the power units 310 may be all equidistantly connected with the capacitor end terminal N− through a second bus, and the midpoints of the DC sides of the power units 310 may be all equidistantly connected with the capacitor midpoint N through a third bus. In practices, the present disclosure includes but is not limited to this connection way. The connection way is not limited herein, and depends on the actual situation. All the implementations fall within the protection scope of the present disclosure.

It should be noted that in the inverter module according to the embodiment, in a case that the number of the capacitors C is greater than two, some capacitors C may be connected in parallel with each other, and the parallel connection is implemented in a different manner from the parallel connection of capacitors through the capacitor bus-bar in the conventional technology.

In a case that some capacitors C are arranged between the first bus and the third bus, the capacitors C are connected in parallel with each other through the first bus and the third bus. In a case that some capacitors C are arranged between the second bus and the third bus, the capacitors C are connected in parallel with each other through the second bus and the third bus. That is, the capacitors are connected in parallel with each other through the same buses as buses used for connecting the DC sides of the power units in parallel with each other, rather than arranging the additional capacitor bus-bar in the conventional technology. Compared with the connection of the DC sides through two bus-bars in the conventional technology, the embodiment has advantages of smaller parasitic inductance, less length of the bus and less connection points.

In some embodiments, the first bus 210, the second bus 220 and the third bus 230 are implemented by cables or conductive bars, which are not limited herein, and depend on the actual situation. All the implementations fall within the protection scope of the present disclosure. Preferably, the first bus 210, the second bus 220 and the third bus 230 are implemented by the conductive bars. In a case that the first bus 210, the second bus 220 and the third bus 230 are implemented by the conductive bars, the first bus 210, the second bus 220 and the third bus 230 may be integrated into a laminated conductive bar. In this way, cost and difficulty of the connection can be reduced.

In some embodiments, the conductive bar may be a copper bar or an aluminum bar. In practices, the conductive bar may be of another type, which is not limited herein, and depends on the actual situation. All the implementations fall within the protection scope of the present disclosure.

The number of levels of the inverter module according to the embodiment may be determined according to the actual requirements, which is not limited herein. All the implementations fall within the protection scope of the present disclosure. In some embodiments, the number of levels of the inverter module is 3, that is, a three-level inverter module.

In a case that the number of the power units 310 in each group is greater than one, the power units 310 are connected in parallel with each other, that is, same type of ports of the power units 310 are connected with each other.

In some embodiments, all the power units 310 in each group are connected in parallel with each other through an intermediate circulation bus and an AC bus 320. In practices, the connection is not limited to the embodiment. The connection may be determined according to the actual situation. All the implementations fall within the protection scope of the present disclosure.

It should be noted that the use of the intermediate circulation bus can achieve a same potential between the same type of ports of the power units 310, so as to further ensure the current sharing between the power units 310. Under a special operation condition, the intermediate circulation bus can further achieve protection of the power units 310.

In some embodiments, based on the above embodiment, an AC side connection point "AC" formed by connecting the AC sides of the power units 310 in parallel with each other may be equidistant from the AC sides of the power units 310, so that current flowing from the AC side connection point "AC" to the AC sides of the power units 310 are the same, thereby further improving the current sharing between the inverter module.

In some embodiments, in a case that the number of the power units 310 in each group is equal to two, as shown in FIGS. 1 and 3, the AC bus 320 is arranged so that the two power units 310 are fully symmetrical with respect to the AC bus 320, to achieve the current sharing between the AC sides of the two power units 310. In a case that the number of the power units 310 in each group is greater than two, the AC bus 320 is required to be specially designed to achieve the current sharing between the AC sides of the power units 310.

It should be noted that in practices, the AC side connection point "AC" formed by connecting the AC sides of the power units 310 in each group in parallel with each other serves as an AC side connection port of the group. In a case that the inverter module includes three power unit groups, the AC side connection points of the three power unit groups respectively serve as a first phase connection port, a second phase connection port and a third phase connection port of the AC side of the inverter module.

In some embodiments, the power units 310 are arranged at an equal interval in a straight line, as shown in FIGS. 1, 2 and 3. In this way, the AC bus 320 is more easily designed to achieve the current sharing, so that the AC bus 320 has a simple structure. In practices, the arrangement of the power units 310 is not limited to the above, and depends on the actual situation. All the implementations fall within the protection scope of the present disclosure.

In some embodiments, each of the power units 310 may be implemented by multiple independent IGBT modules connected with each other, or may be implemented by a packaged module. In practices, the implementation of the power unit 310 is not limited to the above embodiment, and depends on the actual situation. All the implementations fall within the protection scope of the present disclosure.

Figure 4A:
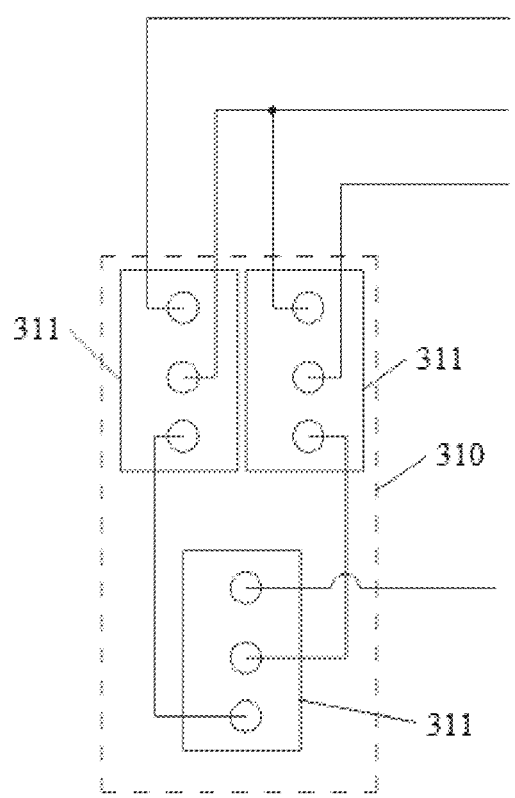
FIG. 4*a* is a schematic structural diagram of a power unit 310.
Figure 6:
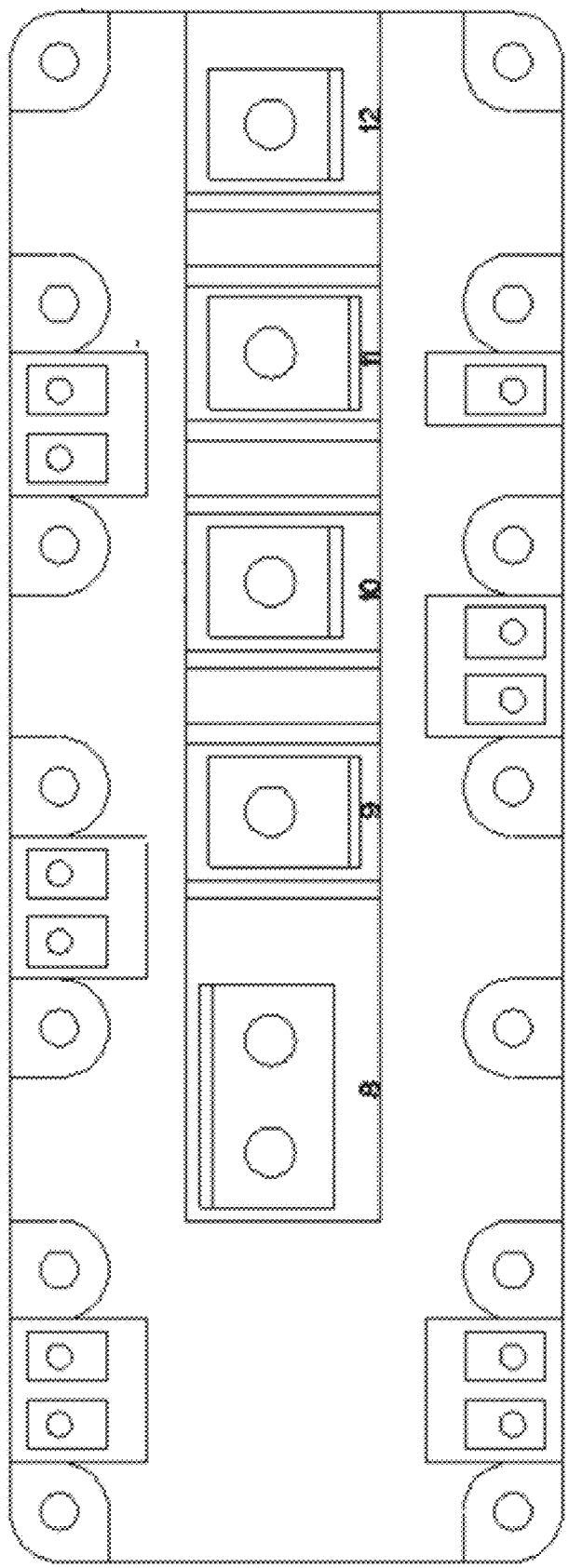
FIG. 6 is a schematic diagram of a three-level packaged module.

In some embodiments, in a case that the inverter module is a three-level inverter module, as shown in FIG. 4a, each of the power units 310 may be implemented by three independent two-level IGBT modules 311 connected with each other. The three two-level IGBT modules 311 are connected in a Y-type three-level inverter topology. Alternatively, as shown in FIG. 6, each of the power units 310 may be implemented by a three-level packaged module, which has an equivalent circuit to the Y-type three-level inverter topology.

In some embodiments, each of the two-level IGBT modules 311 may be a packaged module of 62 mm or a packaged module of EconoDUAL. The packaging of the two-level IGBT module is not limited herein, and depends on the actual situation. All the implementations fall within the protection scope of the present disclosure.

In some embodiments, in a case that each of the power units 310 is implemented by three two-level IGBT modules 311 connected with each other, the three two-level IGBT modules 311 may be arranged in a Y-shape, as shown in FIG. 4a. Alternatively, the three two-level IGBT modules 311 may be arranged in a straight line (not shown). In practices, the arrangement of the three two-level IGBT modules is not limited to the above embodiments, and depends on the actual situation. All the implementations fall within the protection scope of the present disclosure.

Figure 5A:
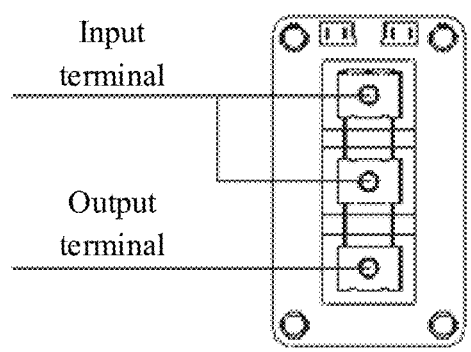
FIGS. 5*a* and 5*b* are schematic diagrams respectively showing two arrangement manners of a two-level power unit 310.
Figure 5B:
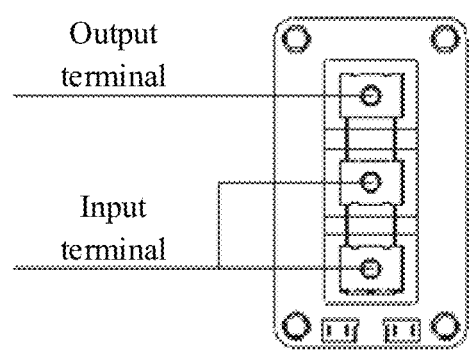

In some embodiments, in a case that the three two-level IGBT modules 311 are arranged in the Y-shape, two two-level IGBT modules 311 connected with the positive pole and the negative pole of the DC side of the power unit 310 are arranged in a forward direction, as shown in FIG. 5a, that is, two input terminals of each of the two two-level IGBT modules are arranged above an output terminal of the two-level IGBT module. The two-level IGBT module 311 connected with the AC side of the power unit 310 is arranged in a reversed direction, as shown in FIG. 5b, that is, two input terminals of the two-level IGBT module are arranged below an output terminal of the two-level IGBT module. It should be noted that in practices, the arrangement of the two-level IGBT module 311 is not limited to the above embodiments, and depends on the actual situation. All the implementations fall within the protection scope of the present disclosure.

In some embodiments, the AC bus 320 and the intermediate circulation bus may be implemented by conductive bars or cables, which are not limited herein and depends on the actual situation. All the implementations fall within the protection scope of the present disclosure. Preferably, the AC bus 320 and the intermediate circulation bus are implemented by the conductive bars. In a case that the AC bus 320 and the intermediate circulation bus of the power units 310 in each group are implemented by the conductive bars, the AC bus 320 and the intermediate circulation bus may be integrated into a laminated conductive bar. In this way, the cost and difficulty of the connection can be reduced, and the current sharing can be achieved in a simply way. In practices, the implementation of the AC bus 320 and the intermediate circulation bus is not limited to the above embodiments, and depends on the actual situation. All the implementations fall within the protection scope of the present disclosure.

Figure 4B:
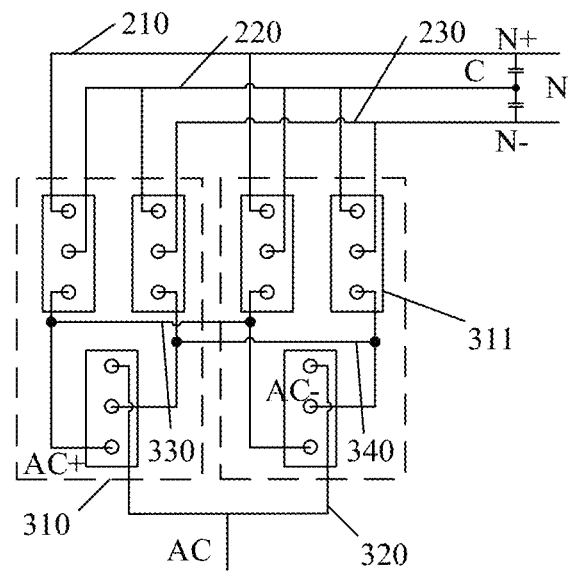
FIG. 4*b* is a schematic structural diagram of power units 310 in an inverter module according to an embodiment of the present disclosure.

In some embodiments, in a case that each of the power units 310 in each group is implemented by three independent two-level IGBT modules 311 connected with each other, and each group including two power units 310 for example, as shown in FIG. 4b, the intermediate circulation bus includes a positive circulation bus 330 and a negative circulation bus 340.

In each of the power units 310, a midpoint of an IGBT module connected with the positive pole of the DC side of the power unit is connected with a first input terminal of an bottom IGBT module (for example, the IGBT module arranged at bottom of FIG. 4b) through the positive circulation bus 330, so that midpoints (for example, AC+ shown in FIG. 4b) of upper bridge arms of the power units 310 have a same potential. In each of the power units 310, a midpoint of an IGBT module connected with the negative pole of the DC side of the power unit is connected with a second input terminal of the bottom IGBT module (for example, the IGBT module arranged at bottom of FIG. 4b) through the negative circulation bus 340, so that midpoints (for example, AC− shown in FIG. 4b) of lower bridge arms of the power units 310 have a same potential.

In some embodiments, in a case that the positive circulation bus 330, the negative circulation bus 340 and the AC bus 320 are integrated into a laminated conductive bar, the AC bus 320, the negative circulation bus 340 and the positive circulation bus 330 are laminated in the listed sequence from top to bottom.

It should be noted that in a case that the power unit 310 is implemented by the three-level packaged module having an equivalent circuit to the Y-type three-level inverter topology, the circulation current buses may further be designed as the above embodiments, which is not limited herein. All the implementations fall within the protection scope of the present disclosure.

An inverter is provided according to an embodiment of the present disclosure. Referring to FIGS. 7a to 7f, the inverter includes a radiator 400 and the inverter module according to the embodiments described above.

All the power units 310 in the inverter module are arranged on the radiator 400. In a case that the inverter module includes the first bus 210, the second bus 220 and the third bus 230, the first bus 210, the second bus 220, the third bus 230 and all the capacitors C in the inverter module are arranged on a same side of the power units 310.

In some embodiments, the first bus 210, the second bus 220, the third bus 230 and all the capacitors C may be arranged above the power units 310, as shown in FIGS. 7*a* to 7*f*, or may be arranged on a left side or a right side of the power units 310 (not shown), which is not limited herein, and depends on the actual situation. All the implementations fall within the protection scope of the present disclosure.

Figure 7A:
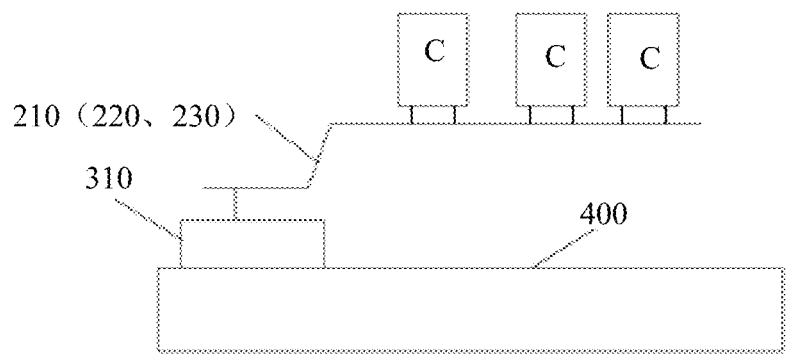
FIGS. 7*a* to 7*f* are respectively schematic structural diagrams of an inverter according to six embodiments of the present disclosure.
Figure 7B:
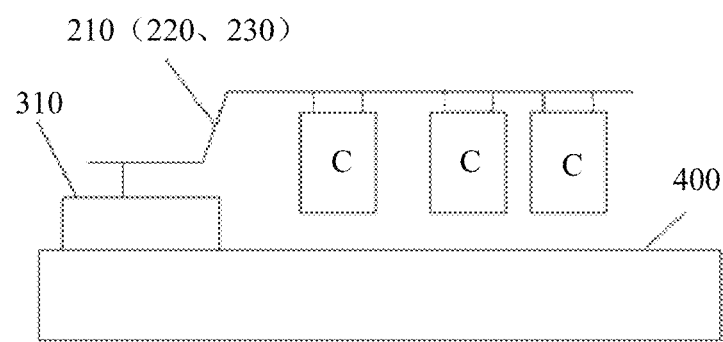
Figure 7C:
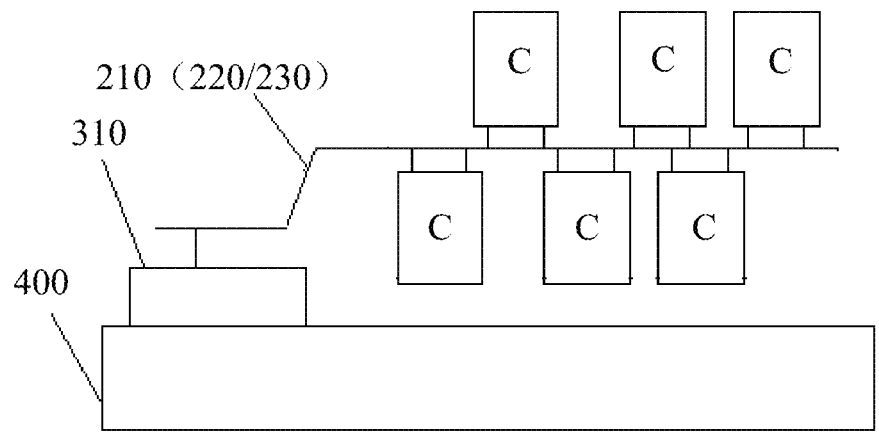
Figure 7D:
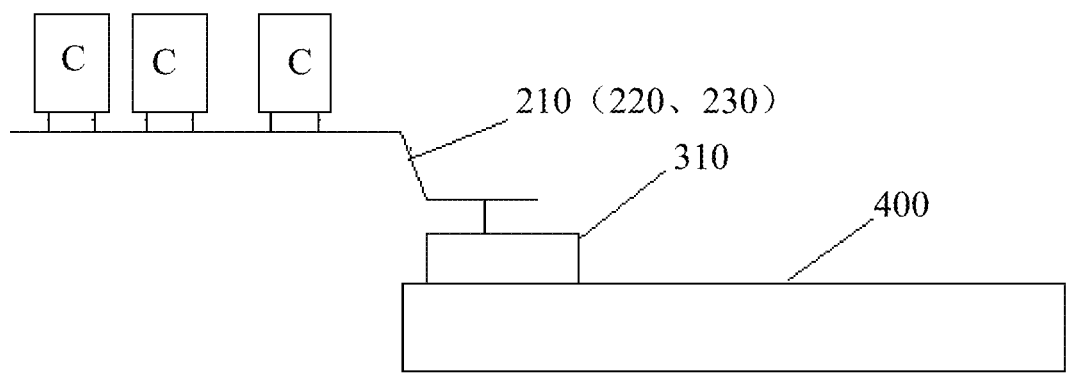
Figure 7E:
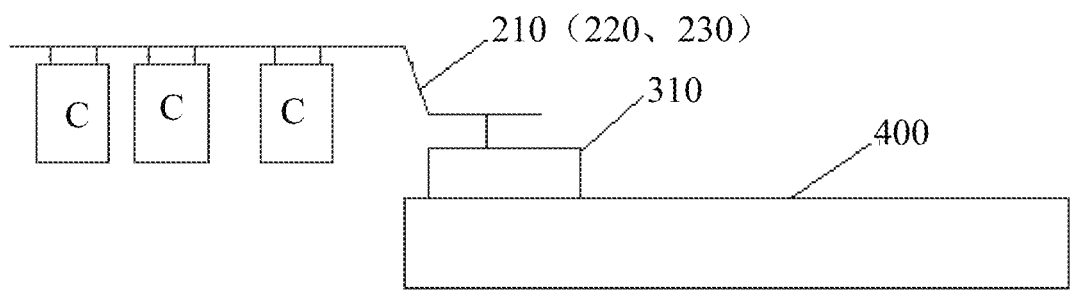
Figure 7F:
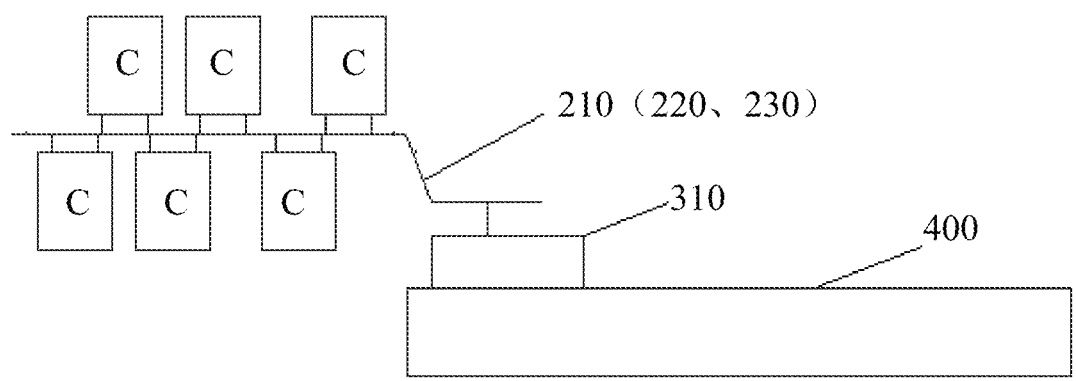

In some embodiments, the first bus 210, the second bus 220, the third bus 230 and all the capacitors C may be arranged on a same side of the radiator 400, as shown in FIGS. 7*a* to 7*c*, or may be arranged on different sides of the radiator 400, as shown in FIGS. 7*d* to 7*f*, which is not limited herein, and depends on the actual situation. All the implementations fall within the protection scope of the present disclosure.

In some embodiments, the capacitors C may be all arranged above the first bus 210, the second bus 220 and the third bus 230, as shown in FIG. 7*a* or 7*d*, or may be all arranged below the first bus 210, the second bus 220 and the third bus 230, as shown in FIG. 7*b* or 7*e*, or may be respectively arranged above and below the first bus 210, the second bus 220 and the third bus 230, as shown in FIG. 7*c* or 7*f*, which is not limited herein, and depends on the actual situation. All the implementations fall within the protection scope of the present disclosure.

By the embodiment shown in FIG. 7*a*, the internal space of the inverter module can be saved. In addition, this embodiment is easy to implement.

Compared with the embodiment shown in FIG. 7*a*, the embodiment shown in FIG. 7*b* has better space utilization, that is, the internal space of the inverter module can be further saved. However, under a same heat dissipation condition, the heat dissipation effect of the inverter module may be reduced.

Compared with the embodiment shown FIG. 7*b*, the embodiment shown in FIG. 7*c* has even better space utilization, that is, the internal space of the inverter module can be further saved. However, under a same heat dissipation condition, the heat dissipation effect of the inverter module may be further reduced. In addition, the arrangement of the capacitors C is required to be changed.

Compared with the embodiment shown FIG. 7*a*, the embodiment shown in FIG. 7*d* requires more internal space of the inverter module, but the overall heat dissipation effect of the inverter module can be improved.

The advantages and disadvantages of the embodiments shown in FIGS. 7*e* and 7*f* can be derived with reference to the above description, which are not described herein.

It should be noted that, the inverter module according to the embodiment shown in FIG. 7*a* has high space utilization and good heat dissipation effect, and is easy to implement. Therefore, the embodiment shown in FIG. 7*a* is a preferred embodiment, which can not only save the internal space of the inverter module to ensure a compact structure of the inverter module, but also can improve the power density of the inverter module.

Figure 8A:
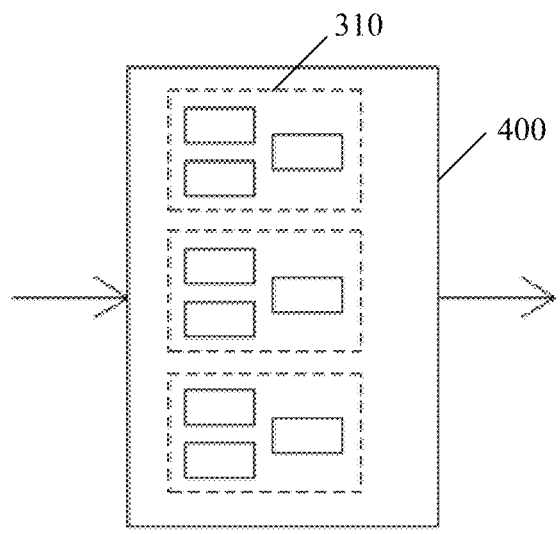
FIGS. 8*a* to 8*f* are respectively schematic structural diagrams of a radiator 400 according to six embodiments of the present disclosure.
Figure 8B:
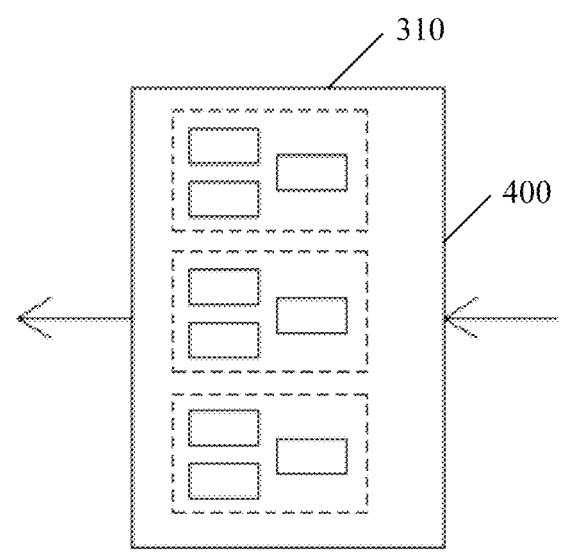
Figure 8C:
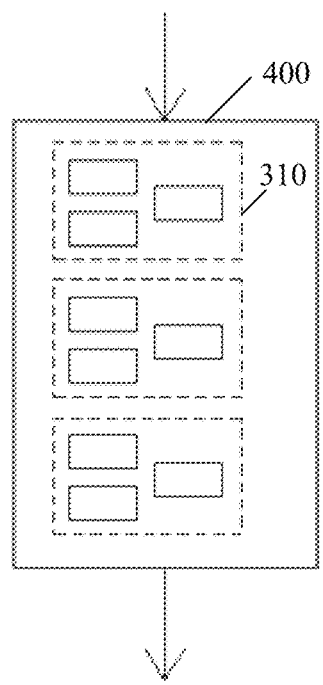
Figure 8D:
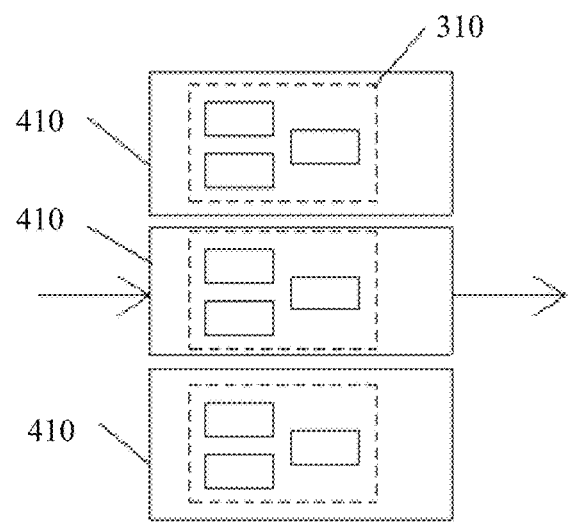
Figure 8E:
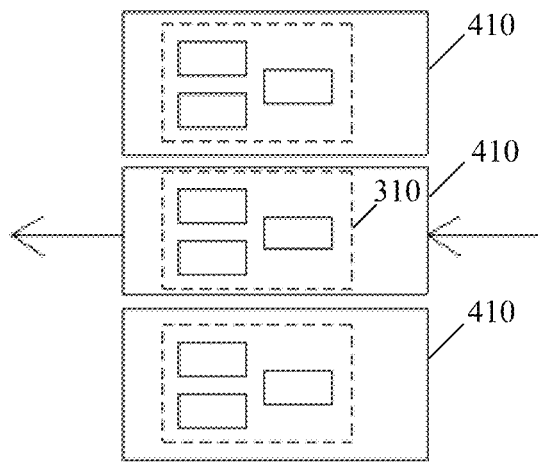
Figure 8F:
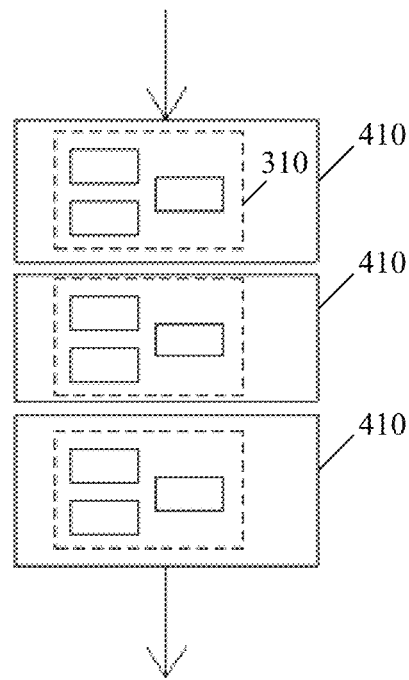

In some embodiments, the radiator 400 may be an integral radiator, as shown in FIGS. 8*a*, 8*b* and 8*c*. The radiator 400 may alternatively include at least two independent sub-radiators 410, as shown in FIGS. 8*d*, 8*e* and 8*f*, so that the power unit groups or the power units 310 are separately arranged on the sub-radiators. In practices, the radiator is not limited to the above embodiments, and depends on the actual situation. All the implementations fall within the protection scope of the present disclosure.

It should be noted that, for the radiator 400 being the integral radiator, due to a large size and area of the integral radiator, the integral radiator is more difficult to be manufactured and assembled. For the radiator 400 including multiple independent sub-radiators 410, the size and area of the sub-radiators 410 are smaller than the integral radiator, which is convenient for manufacturing and assembly. In addition, the arrangement of the sub-radiators 410 is more flexible. That is, the power unit 310 group or the power unit 310 may be arranged based on the actual heat dissipation requirements of the power unit groups or power units 310, so that the overall heat dissipation effect of the inverter module can be improved.

It should be noted that, for the radiator 400 including multiple independent sub-radiators 410, structures of the independent sub-radiators 410 may be different to meet the requirements on the heat dissipation of the power unit 310 and the flow direction of heat dissipation medium. The structures of the independent sub-radiators are not limited herein, and may be changed according to the actual situations. All the implementations fall within the protection scope of the present disclosure.

In some embodiments, based on the above embodiments of the radiator 400, the heat dissipation medium of the radiator 400 may flow in one of the following three directions. According to a first embodiment, as shown in FIGS. 8*a* and 8*d*, the heat dissipation medium of the radiator 400 flows from the DC sides of the power units 310 to the AC sides of the power units 310. According to a second embodiment, as shown in FIGS. 8*b* and 8*e*, the heat dissipation medium of the radiator 400 flows from the AC sides of the power units 310 to the DC sides of the power units 310. According to a third embodiment, as shown in FIGS. 8*c* and 8*f*, the heat dissipation medium of the radiator 400 flows along an arrangement direction of the power units 310 in each group.

In practices, the flow direction of the heat dissipation medium of the radiator 400 is not limited to the above embodiments, and depends on the actual situation. All the implementations fall within the protection scope of the present disclosure.

In some embodiments, the radiator 400 may be an air cooling radiator. In this case, the heat dissipation medium is air. Alternatively, the radiator 400 may be a liquid cooling radiator, in which the heat dissipation medium is water or other heat dissipation liquid. In practices, the radiator 400 is not limited to the above embodiments, and depends on the actual situation. All the implementations fall within the protection scope of the present disclosure.

Figure 9:
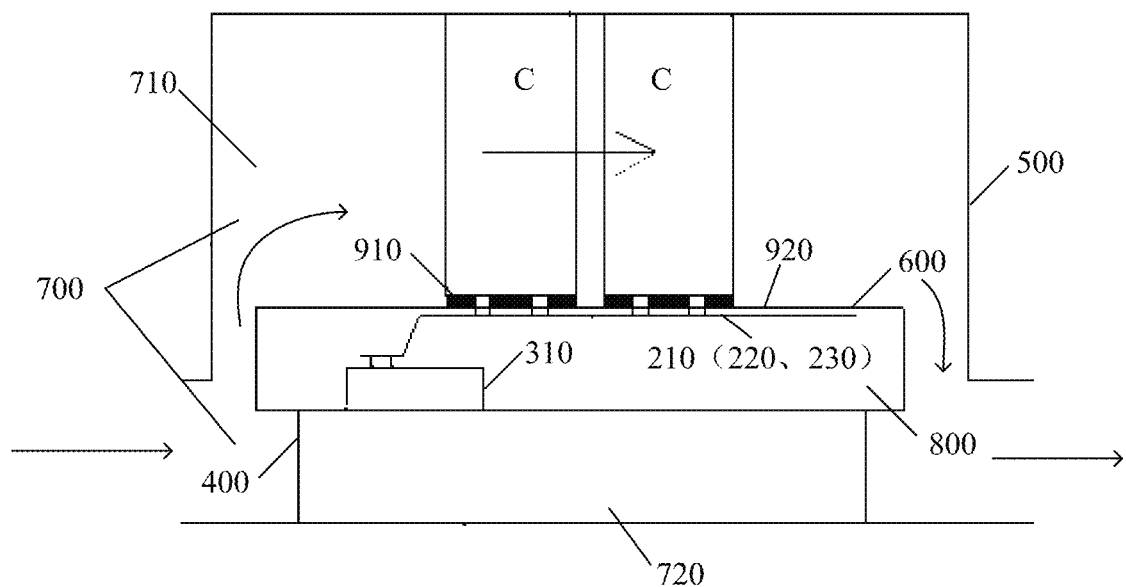
FIGS. 9 to 11 are respectively schematic structural diagrams of an inverter according to three embodiments of the present disclosure.
Figure 10:
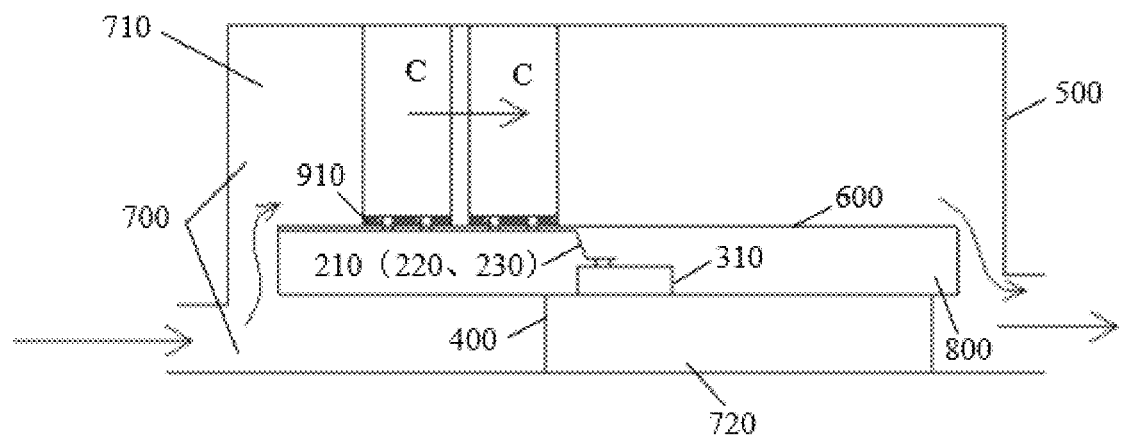
Figure 11:
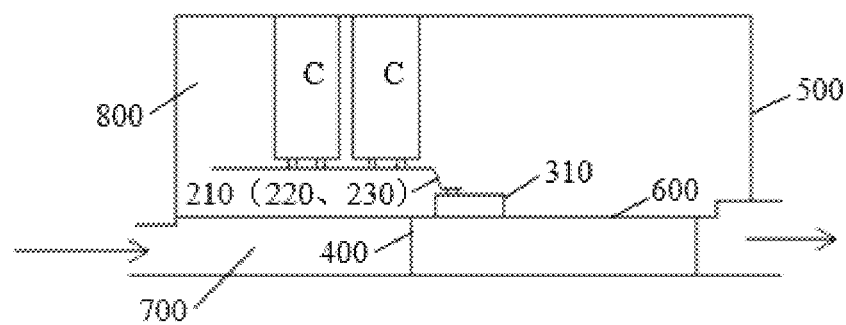

According to another embodiment, as shown in FIGS. 9, 10 and 11, the inverter further includes a first housing 500 and a second housing 600.

A first chamber 700 is defined as a space inside the first housing 500 and outside the second housing 600. A second chamber 800 is defined as a space inside the second housing 600. The second chamber 800 is configured as a high protection chamber. An inlet for the heat dissipation medium of the inverter module and an outlet for the heat dissipation medium of the inverter module are arranged on the first housing 500.

It should be noted that the high protection chamber is a chamber that requires high protection degree. Normally a power device that owns a low protection degree and/or requires a high protection degree is arranged in the high protection chamber. In addition, the first chamber 700 may or may not be configured as the high protection chamber. Normally a device that does not require a high protection degree is arranged in the first chamber 700, to directly perform heat exchange with the outside, so as to save the cost of the heat dissipation.

In a case that the first housing 500 and the second housing 600 are separated from each other, as shown in FIGS. 9 and 10, the first chamber 700 includes a first sub-chamber 710 and a second sub-chamber 720 that are communicated with each other. In view of the requirements of the heat dissipation and protection, all the capacitors C are arranged in the first sub-chamber 710, the radiator 400 in the inverter module is arranged in the second sub-chamber 720, and the first bus 210, the second bus 220, the third bus 230, connection ports of all the capacitors C and all the power units 310 are arranged in the second chamber 800. In this structure having independent ventilating sub-chambers, the radiator 400 and the capacitors C are arranged in different chambers, which can improve the heat dissipation effect of the capacitors C.

In some embodiments, the first sub-chamber 710 may dissipate heat by air or liquid, which is not limited herein, and depends on the actual situation. All the implementations fall within the protection scope of the present disclosure. In a case that the first sub-chamber 710 dissipates heat by air, the first sub-chamber 710 serves as a ventilating passage. In a case that the first sub-chamber 710 dissipates heat by liquid, the first sub-chamber 710 serves as a flow passage of heat dissipation liquid.

The heat dissipation manner of the second sub-chamber 720 depends on the radiator 400. In a case that the radiator 400 is an air cooling radiator, the second sub-chamber 720 dissipates heat by air, that is, the second sub-chamber 720 serves as a ventilating passage. In a case that the radiator 400 is a liquid cooling radiator, the second sub-chamber 720 dissipates heat by liquid, that is, the second sub-chamber 720 serves as a flow passage of the heat dissipation liquid.

In some embodiments, the first sub-chamber 710 and the second sub-chamber 720 may share the inlet and the outlet of the heat dissipation medium, or may be provided with respective inlets and outlets of the heat dissipation medium, which is not limited herein, and depends on the actual situation. All the implementations fall within the protection scope of the present disclosure.

In a case that the first sub-chamber 710 dissipates heat by air and the radiator 400 is an air cooling radiator, the first sub-chamber 710 serves as a first ventilating passage of the inverter, and the second sub-chamber 720 serves as a second ventilating passage of the inverter. If the first ventilating passage and the second ventilating passage share an air inlet and an air outlet, the first ventilating passage is a secondary ventilating passage of the inverter and the second ventilating passage is a primary ventilating passage of the inverter. That is, when external air enters the inverter from the air inlet, most of the air enters the second sub-chamber 720, i.e., the ventilating passage of the radiator 400, to ensure the heat dissipation of all the power units 310 in the inverter module. In addition, the other small part of the air enters the first sub-chamber 710, to ensure the heat dissipation of all the capacitors C. The air entering the second sub-chamber 720 and the air entering the first sub-chamber 710 flows out of the air outlet together.

In addition, it should be noted that in practices, the first sub-chamber 710 may not be communicated with the second sub-chamber 720. For example, the first sub-chamber 710 is not communicated with the second sub-chamber 720, the first sub-chamber 710 dissipates heat by air and the second sub-chamber 720 dissipates heat by liquid. In this case, the first sub-chamber 710 serves as a ventilating passage of the inverter, and the second sub-chamber 720 serves as a flow passage of heat dissipation liquid. The first sub-chamber 710 and the second sub-chamber 720 are isolated from each other.

In some embodiments, a flow direction of the heat dissipation medium of at least one of the first sub-chamber 710 and the second sub-chamber 720 may be the same as a flow direction of the heat dissipation medium of the radiator 400. Alternatively, a flow direction of the heat dissipation medium of the first sub-chamber 710 and a flow direction of the heat dissipation medium of the second sub-chamber 720 may each be different from the flow direction of the heat dissipation medium of the radiator 400, which are not limited herein. All the implementations fall within the protection scope of the present disclosure. Preferably, as shown in FIG. 10, the flow direction of the heat dissipation medium of the first sub-chamber 710 and the flow direction of the heat dissipation medium of the second sub-chamber 720 are both the same as the flow direction of the heat dissipation medium of the radiator 400.

In some embodiments, an insulating plate 920 and a sealing plate 910 are further arranged between the capacitors C and the second housing 600, for insulating and isolating. In practices, this function may be achieved in other ways, which are not limited herein, and depends on the actual situation. All the implementations fall within the protection scope of the present disclosure.

In some embodiments, the first housing 500 partially coincides with the second housing 600, as shown in FIG. 11, to form the closed second chamber 800 and the first chamber 700 outside the second chamber 800. The radiator 400 is arranged in the first chamber 700. The first bus 210, the second bus 220, the third bus 230, all the capacitors C, connection ports of all the capacitors C and all the power units 310 are arranged in the second chamber 800.

The heat dissipation manner of the first chamber 700 depends on the radiator 400. In a case that the radiator 400 is the air cooling radiator, the first chamber 700 dissipates heat by air, that is, the first chamber 700 serves as the ventilating passage. In a case that the radiator 400 is the liquid cooling radiator, the first chamber 700 dissipates heat by liquid, that is, the first chamber 700 serves as the flow passage of the heat dissipation liquid. The heat dissipation manner of the first chamber 700 is not limited herein, and depends on the actual situation. All the implementations fall within the protection scope of the present disclosure.

It should be noted that since all the capacitors C are arranged in the second chamber 800, compared with the above embodiment, the heat dissipation effect of all the capacitors C is reduced in this embodiment.

In practices, the arrangement of the first chamber 700 and the second chamber 800 is not limited to the above embodiments, and depends on the actual situation. All the implementations fall within the protection scope of the present disclosure.

Based on the above description of the embodiments, features in the embodiments may be replaced or combined with each other, so that those skilled in the art can implement or carry out the present disclosure. The above description shows only some preferred embodiments of the present disclosure and is not intended to be limitation in any form. Those skilled in the art may make, based on the disclosed methods and technical content, some variations and improvements on the technical solutions of the present disclosure, or make some equivalent variations on the embodiments without departing from the scope of the technical solutions. Therefore, any simple modifications, equivalent variations and improvements on the above embodiments made based on the technical essence of the present disclosure, without departing the content of the technical solutions of the present disclosure, fall within the protection scope of the technical solutions of the present disclosure.

The invention claimed is:

1. An inverter module, comprising:
at least two capacitors, and
at least one power unit group, wherein,
the at least one power unit group each comprises one or more power units;
the capacitors are connected in series and parallel to form a capacitor head terminal, a capacitor end terminal and a capacitor midpoint, wherein capacitance between the capacitor midpoint and the capacitor head terminal is the same as capacitance between the capacitor midpoint and the capacitor end terminal; and
positive poles of direct current (DC) sides of the power units are equidistantly connected with the capacitor head terminal, negative poles of the DC sides of the power units are equidistantly connected with the capacitor end terminal, and midpoints of the DC sides of the power units are equidistantly connected with the capacitor midpoint.

2. The inverter module according to claim 1, wherein, the positive poles of the DC sides of the power units are equidistantly connected with the capacitor head terminal through a first bus, the negative poles of the DC sides of the power units are equidistantly connected with the capacitor end terminal through a second bus, and the midpoints of the DC sides of the power units are equidistantly connected with the capacitor midpoint through a third bus.

3. The inverter module according to claim 2, wherein, the first bus, the second bus and the third bus are implemented by cables or conductive bars;
the first bus, the second bus and the third bus are implemented by the conductive bars, and are integrated into a laminated conductive bar; and
the conductive bars are copper bars or aluminum bars.

4. The inverter module according to claim 1, wherein, in a case that the at least one power unit group each comprises more than one power units, the power units in each power unit group are connected in parallel with each other to form an alternating current (AC) side connection point, wherein the AC side connection point is equidistant from AC sides of the power units.

5. The inverter module according to claim 4, wherein, the power units in each power unit group are connected in parallel with each other through an intermediate circulation bus and an AC bus; and
the AC bus and the intermediate circulation bus in each of the power units are integrated into a laminated conductive bar.

6. The inverter module according to claim 1, wherein, each of the power units is implemented by a plurality of independent IGBT modules connected with each other, or implemented by a packaged module.

7. The inverter module according to claim 6, wherein, in a case that the inverter module is a three-level inverter module, each of the power units is implemented by three two-level IGBT modules connected with each other, or implemented by a three-level packaged module.

8. The inverter module according to claim 6, wherein, in a case that each of the power units is implemented by three two-level IGBT modules connected with each other, the three two-level IGBT modules are arranged in a Y-shape, or arranged in a straight line.

9. The inverter module according to claim 1, wherein, the power units in each power unit group are arranged at an equal interval in a straight line.

10. An inverter, comprising:
a radiator, and
the inverter module according to claim 1,
wherein all the power units in the inverter module are arranged on the radiator.

11. The inverter according to claim 10, wherein, in a case that the inverter module comprises a first bus, a second bus and a third bus, the first bus, the second bus, the third bus and all the capacitors in the inverter module are arranged on a same side of the power units.

12. The inverter according to claim 11, wherein, the first bus, the second bus, the third bus and all the capacitors are arranged above the power units; or
the first bus, the second bus, the third bus and all the capacitors are arranged on a left side or a right side of the power units.

13. The inverter according to claim 11, wherein, the first bus, the second bus, the third bus and all the capacitors are arranged on a same side of the radiator, or arranged on different sides of the radiator.

14. The inverter according to claim 13, further comprising a first housing and a second housing, wherein,
a first chamber is defined as a space inside the first housing and outside the second housing;
a second chamber is defined as a space inside the second housing and is configured as a high protection chamber; and
an inlet for a heat dissipation medium of the inverter module and an outlet for the heat dissipation medium of the inverter module are arranged on the first housing.

15. The inverter according to claim 13, wherein, the first housing and the second housing are independent of each other, the first chamber comprises a first sub-chamber and a second sub-chamber that are communicated with each other, wherein,
all the capacitors are arranged in the first sub-chamber;
the radiator is arranged in the second sub-chamber; and
the first bus, the second bus, the third bus, connection ports of all the capacitors and all the power units are arranged in the second chamber.

16. The inverter according to claim 13, wherein, in a case that the radiator is an air cooling radiator, the first sub-chamber serves as a first ventilating passage of the inverter, and the second sub-chamber serves as a second ventilating passage of the inverter.

17. The inverter according to claim 13, wherein, an insulating plate and a sealing plate are arranged between the capacitors and the second housing.

18. The inverter according to claim 13, wherein, the first housing partially coincides with the second housing to form the closed second chamber and the first chamber outside the second chamber, the radiator is arranged in the first chamber, and the first bus, the second bus, the third bus, all the capacitors and all the power units are arranged in the second chamber.

19. The inverter according to claim 11, wherein,
the capacitors are arranged on a same side of the first bus, the second bus and the third bus, or arranged on two sides of the first bus, the second bus and the third bus.

20. The inverter according to claim 10, wherein,
the radiator is an integral radiator; or
the radiator comprises at least two independent sub-radiators, wherein the at least two independent sub-radiators each is arranged with some of the power units.

* * * * *